US 6,628,923 B1

(12) United States Patent
Eriksson

(10) Patent No.: US 6,628,923 B1
(45) Date of Patent: Sep. 30, 2003

(54) ADAPTIVE PHASE AND AMPLITUDE LINEARIZATION METHOD AND APPARATUS

(75) Inventor: Peter Eriksson, Sollentuna (SE)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/563,513

(22) Filed: May 3, 2000

(51) Int. Cl.[7] .................................................. H04B 7/00
(52) U.S. Cl. ........................ 455/67.3; 455/67.1; 455/62; 455/63; 455/33.1; 324/605; 324/613; 324/76.13; 324/85
(58) Field of Search ............................ 455/67.1, 226.1, 455/62, 63, 33.1, 33.2, 33.3, 54.1, 42.1, 56.1, 57.1, 67.3; 324/605, 613, 76.23, 85

(56) References Cited

U.S. PATENT DOCUMENTS

| | | | |
|---|---|---|---|
| 4,262,727 A | 4/1981 | Schifferly | 157/1.24 |
| 5,049,832 A | 9/1991 | Cavers | 330/149 |
| 5,351,016 A | 9/1994 | Dent | 332/103 |
| 5,381,357 A | 1/1995 | Wedgwood et al. | 364/724.16 |
| 5,404,322 A | 4/1995 | Gehring | 364/724.16 |
| 5,444,696 A * | 8/1995 | Petranovich | 370/280 |
| 5,581,190 A * | 12/1996 | Herring et al. | 324/605 |
| 5,591,945 A * | 1/1997 | Kent | 235/451 |
| 5,732,333 A | 3/1998 | Cox et al. | 455/126 |
| 5,870,668 A | 2/1999 | Takano et al. | 455/126 |
| 5,898,338 A | 4/1999 | Proctor et al. | 330/149 |
| 5,922,956 A | 7/1999 | Rhodes | 73/579 |
| 5,923,214 A | 7/1999 | Mitzlaff | 330/52 |
| 5,929,628 A | 7/1999 | Becker et al. | 324/158.01 |
| 5,959,500 A | 9/1999 | Garrido | 330/151 |
| 5,966,314 A | 10/1999 | Lee | 364/724.16 |
| 5,982,832 A | 11/1999 | Ko | 375/371 |
| 5,987,485 A | 11/1999 | Spreadbury | 708/322 |
| 6,054,896 A | 4/2000 | Wright et al. | 330/149 |

FOREIGN PATENT DOCUMENTS

| | | | |
|---|---|---|---|
| EP | 0 928 062 A1 | 7/1999 | H03F/1/32 |

OTHER PUBLICATIONS

Measurement of frequency converter group delay, Reprinted from Microwave Engineering Europe; Jul./Aug. 1990, pp. 1–4.

High–Speed Measurement of digital Wireless System SNR by Means of Error Vector Magnitude Analysis, Digital Wireless System EVM Measurement, Http://www.coelacanth/coel/wireless.html, pp. 1–3.

Understanding the Fundamental Principles of Vector Network Analysis, Hewlett Packard, pp. 1–13.

* cited by examiner

*Primary Examiner*—William Trost
*Assistant Examiner*—Danh C Le
(74) *Attorney, Agent, or Firm*—Cohen, Pontani, Lieberman & Pavane

(57) ABSTRACT

A apparatus for computing coefficient values for configuring a digital filter for compensating for non-linearity of an RF/IF device. The apparatus includes a reference signal generator, connected to an input of the RF/IF device, for generating an input reference signal to the RF/IF device. A vector signal analyzer, connected to an output of the RF/IF device, analyzes a response signal from the RF/IF device and outputs digital in-phase and quadrature-phase (I/Q) signals. A processor, connected to an output of said vector signal analyzer, computes a difference between the input reference signal and the digital in-phase and quadrature-phase (I/Q) signals. The processor calculates the coefficient values for configuring the digital filter based on the computed difference. A memory device, connected to the digital filter, stores the calculated coefficient values for the digital filter.

7 Claims, 1 Drawing Sheet

ADAPTIVE PHASE AND AMPLITUDE LINEARIZATION METHOD AND APPARATUS

BACKGROUND OF THE INVENTION

1. Field of the Invention

The present invention relates to radio-frequency (RF) or intermediate-frequency (IF) devices and, in particular, to a method and an apparatus for compensating for non-linear behavior of RF/IF devices.

2. Description of the Related Art

The surge in popularity of mobile phones has prompted the development of a wide variety of RF/IF devices for use in wireless communication systems. Testing and characterization of RF/IF devices play a crucial part in their development, as system designers must accurately assess the performance of these devices in a wireless network. Such testing often involves applying an unmodulated RF carrier to the device and analyzing the response signal generated by the device. The operating characteristics of the RF/IF device are assessed in accordance with the phase and amplitude of the response signal as compared to the phase and amplitude of the input carrier.

RF/IF devices exhibit non-linear behavior, which can be detrimental to the performance of wireless communication equipment. For example, the output signal frequency of these devices may undergo frequency shift (e.g., with mixers) or include frequencies in addition to those of the input signal. There is, however, no prior art method and apparatus for linearizing output signals of RF/IF devices.

SUMMARY OF THE INVENTION

An object of the present invention is to provide a method and apparatus for compensating for non-linear behavior of RF/IF devices for wireless communication systems.

According to one aspect, an adaptive compensating device, in combination with an RF/IF device, includes a digital filter for compensating for non-linearity of the RF/IF device by preprocessing an input signal prior to transmission to the RF/IF device so that an output signal from the RF/IF device is substantially linear with respect to at least one of phase and amplitude of the input signal.

According to another aspect of the invention, for compensation of amplitude ripple, the digital filter is a finite impulse response (FIR) filter. For compensation of group delay, the digital filter is an infinite impulse response (IIR) filter. For compensation of error vector magnitude, the digital filter is a complex filter.

In one embodiment, an apparatus for computing coefficient values for configuring a digital filter for compensating for non-linearity of an RF/IF device includes a reference signal generator, connected to an input of the RF/IF device, for generating an input reference signal to the RF/IF device. A vector signal analyzer, connected to an output of the one of a radio frequency and intermediate frequency device, analyzes a response signal from the RF/IF device and outputs digital in-phase and quadrature-phase (I/Q) signals. A processor, connected to an output of said vector signal analyzer, computes a difference between the input reference signal and the digital in-phase and quadrature-phase (I/Q) signals. The processor calculates the coefficient values for configuring the digital filter based on the computed difference. A memory device, connected to the digital filter, stores the calculated coefficient values for the digital filter.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements.

DETAILED DESCRIPTION OF THE PRESENTLY PREFERRED EMBODIMENTS

Figure 1:
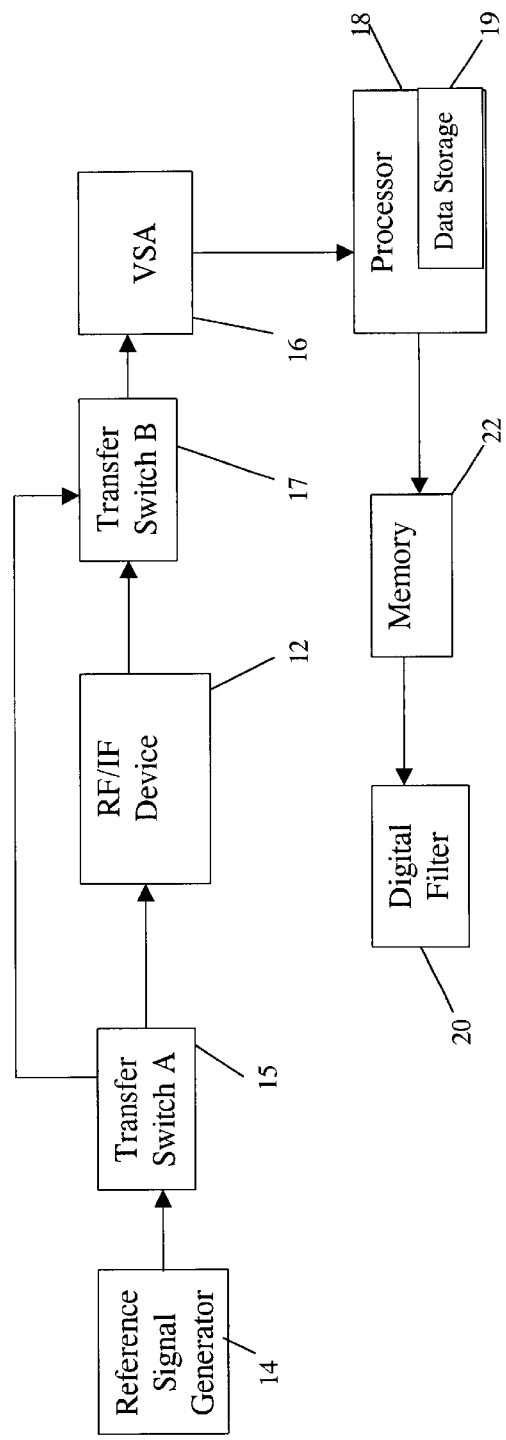
FIG. 1 is a block diagram of an apparatus for measuring an RF/IF device and for computing the requisite parameters for an adaptive compensating device in accordance with one embodiment of the present invention.

FIG. 1 diagrammatically illustrates an apparatus 10 for configuring an adaptive compensating device for compensating for non-linear amplitude and phase characteristics in a radio frequency/intermediate frequency (RF/IF) device 12, which may be formed of a single component or a combination of components, in accordance with one embodiment of the present invention. As used herein, "radio frequency" means the frequency in the portion of the electromagnetic spectrum that is between the audio-frequency and the infra-red portion of the electromagnetic spectrum; and "intermediate frequency" means the frequency to which a signal wave is shifted locally as an intermediate step in transmission or reception.

The apparatus 10 includes a reference signal generator 14, which may be constructed as a separate, standalone unit such as, for example, Rohde & Schwartz AMIQ or Tektronix AWG 2021 waveform generators, for outputting a reference signal containing all of the frequencies of a predetermined bandwidth (e.g., 16 MHz). Optionally, the reference signal generator 14 may be unitarily constructed with the device 12. If the device 12 is an RF device, an RF vector signal generator should be used for frequency up-conversion in front of device 12, i.e., the device under test (DUT). The reference signal may, for example, be a chirp signal (e.g., a saw-tooth FM-modulating carrier) swept over a plurality of frequencies of a predetermined bandwidth or an impulse signal containing all of the frequencies of the predetermined bandwidth. The RF/IF device 12 (e.g., a power amplifier, a transceiver, an IF filter, an RF transmitter, etc.) is constructed to operate over the predetermined bandwidth, receives the reference signal, and outputs a response signal. A vector signal analyzer 16 (VSA) (e.g., HP 4406), connected to an output of the RF/IF device 12, receives the response signal from the RF/IF device 12 and outputs, for example, digital in-phase and quadrature-phase (I/Q) signals based on the response signal. A processor 18, connected to the vector signal analyzer 16, compares the digital I/Q signals with reference signal (which is preferably preloaded or stored in the processor 18) and calculates the difference with respect to the phase and amplitude of the input frequencies of the reference signal caused by the RF/IF device 12. The processor 18 then computes the requisite coefficients for an adaptive compensating device as, for example, an adjustable digital filter 20 such that the RF/IF device 12 in combination with the digital filter 20 provides a response signal that is substantially linear, at least with respect to the amplitude and/or phase characteristics of the input signal over the predetermined bandwidth. The calculated coefficients are then stored in a memory device 22 (e.g., Electrically Erasable Programmable Read-Only Memory (EEPROM)). In one embodiment, the digital filter 20 is configured to delay select frequencies of the input signal so that the relative phase of the frequencies of the input signal over the predetermined bandwidth remains substantially the same as the relative phase of the frequencies of the response signal from the RF/IF device 12.

Preferably, the digital filter 20 is connected to the memory device 22 and the RF/IF device 12 through a digital-to-analog device. The digital filter 20 is preferably a finite impulse response (FIR) filter when amplitude ripple of an amplitude sensitive RF/IF device is to be corrected; optionally, the digital filter 20 may be an infinite impulse response (IIR) filter when group delay of a phase-sensitive device is to be compensated. In an alternative embodiment, the digital filter 20 is configured as a complex filter when error vector magnitude (EVM) is to be compensated. The digital filter 20 may be formed as an Application Specific Integrated Circuit (ASIC) device.

During production testing or calibration when the requisite coefficients have yet to be calculated, transfer switches A and B 15, 17 may be placed upstream and downstream the RF/IF device 12 so as to allow the reference signal to pass through without any processing, and the reference signal stored in data storage 19. Then, the reference signal is fed to the RF/IF device 12 through a digital-to-analog filter (not shown). The VSA 16 analyzes the response signal from the RF/IF device 12 and outputs digital I/Q signals that may also be stored in data storage 19 accessible by the processor 18. The processor 18 receiving the digital I/Q signals (from the vector signal analyzer 16) and the reference signal (from the reference signal generator 14) computes the difference between the stored reference signal and the received digital I/Q signals. Based on the computed difference, the processor 18 calculates, recursively or non-recursively, the requisite coefficients for configuring the digital filter 20 and stores the calculated coefficients in the memory device 22.

Figure 2:
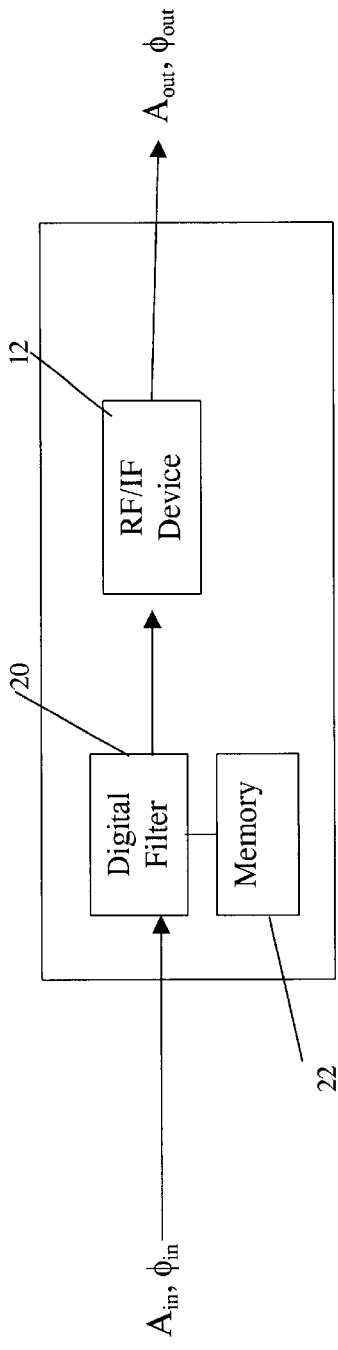
FIG. 2 is a block diagram of an RF/IF device incorporating the adaptive compensating device of FIG. 1.

After this calibration, the RF/IF device 12, its digital filter 20 and the associated memory device 22 are incorporated as a unit into a device, such as a mobile phone, as shown in FIG. 2.

In use, the digital filter 20 accesses the coefficients stored in the memory device 22 and processes (or pre-distorts) an input signal (e.g., a digitized signal representing speech) having amplitude $A_{in}$, and phase $\phi_{in}$, of a predetermined bandwidth. The digital filter 20 processes the input signal and outputs a pre-distorted signal that is fed to the RF/IF device 12 (e.g., a mobile phone) through a digital-to-analog device (not shown). The RF/IF device 12 processes the pre-distorted signal and outputs a response signal having amplitude $A_{out}$ and phase $\phi_{out}$. As a result of the signal processing (or pre-distorting) by the digital filter 20, the ratios of $A_{out}/A_{in}$ and/or $\phi_{out}/\phi_{in}$ are substantially constant. In other words, the response signal of the RF/IF device 12 has been substantially linearized with respect to the input signal.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An adaptive compensating device for compensating for non-linearity of one of a radio frequency and intermediate frequency device, the adaptive compensating device comprising:

an adjustable output digital filter providing as an output signal of said digital filter a signal to the one of a radio frequency and intermediate frequency device; and a means for adjusting the output signal of said digital filter to compensate for non-linearity of the one of a radio frequency and intermediate frequency device by pre-distorting an input signal to received by the one of a radio frequency and intermediate frequency device according to a correction signal so that the one of a radio frequency and an intermediate frequency device outputs a signal that is substantially linear with respect to at least one of amplitude and phase of the input signal over a predetermined bandwidth, the correction signal being a static pre-calculated signal based on measured characteristics of the non-linearity of the one of the radio frequency and intermediate frequency device, the means for adjusting being preconfigured with the correction signal.

2. The device of claim 1, wherein said digital filter is a finite impulse response filter for compensating for amplitude ripple.

3. The device of claim 2, wherein said digital filter is an infinite impulse response filter for compensating for group delay.

4. The device of claim 1, wherein said digital filter is a complex filter for compensating for error vector magnitude.

5. The device of claim 1, wherein the adaptive compensating device comprises a memory device for storing coefficients for said digital filter for generating the correction signal.

6. The apparatus of claim 1, wherein said digital filter is formed as an Application Specific Integrated Circuit (ASIC) device.

7. The apparatus of claim 5, wherein said coefficients in said memory are calculated for said digital filter prior to installation of said digital filter and said memory in said apparatus.

* * * * *